(12) United States Patent
Tzu et al.

(10) Patent No.: US 6,830,702 B2
(45) Date of Patent: Dec. 14, 2004

(54) SINGLE TRENCH ALTERNATING PHASE SHIFT MASK FABRICATION

(75) Inventors: San-De Tzu, Taipei (TW); Chang-Ming Dai, Hsinchu (TW); Chung-Hsing Chang, Hsin-chu (TW); Chen-Hao Hsieh, Ping Chen (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 81 days.

(21) Appl. No.: 10/165,028

(22) Filed: Jun. 7, 2002

(65) Prior Publication Data

US 2003/0226819 A1 Dec. 11, 2003

(51) Int. Cl.⁷ .............................. B44C 1/22; G03F 9/00
(52) U.S. Cl. ................................ 216/41; 216/13; 430/5
(58) Field of Search .......................... 216/13, 41; 430/5

(56) References Cited

U.S. PATENT DOCUMENTS 6,187,480 B1 * 2/2001 Huang ........................... 430/5
6,281,082 B1 * 8/2001 Chen et al. .................. 438/296
6,545,808 B1 * 4/2003 Ehbets et al. ............... 359/566

* cited by examiner

Primary Examiner—Nadine G. Norton
Assistant Examiner—Shamim Ahmed
(74) Attorney, Agent, or Firm—Tung & Associates

(57) ABSTRACT

The invention relates to fabricating a single-trench alternating phase shift mask (PSM). A chromium layer over a mask layer, which is itself over a quartz layer, of the PSM is patterned according to a semiconductor design. The mask layer and the quartz layer are dry etched through a photoresist layer that has been applied over the chromium layer and patterned according to an alternating PSM design. The dry etching initially forms single trenches of the PSM. The quartz layer is next wet etched through the mask layer to completely form the single trenches of the PSM, where the photoresist layer has first been removed. The mask layer is dry etched again, where the single trenches of the PSM are initially filled with filler material to protect the single trenches from the dry etching.

14 Claims, 13 Drawing Sheets

PRIOR ART FIG 1A
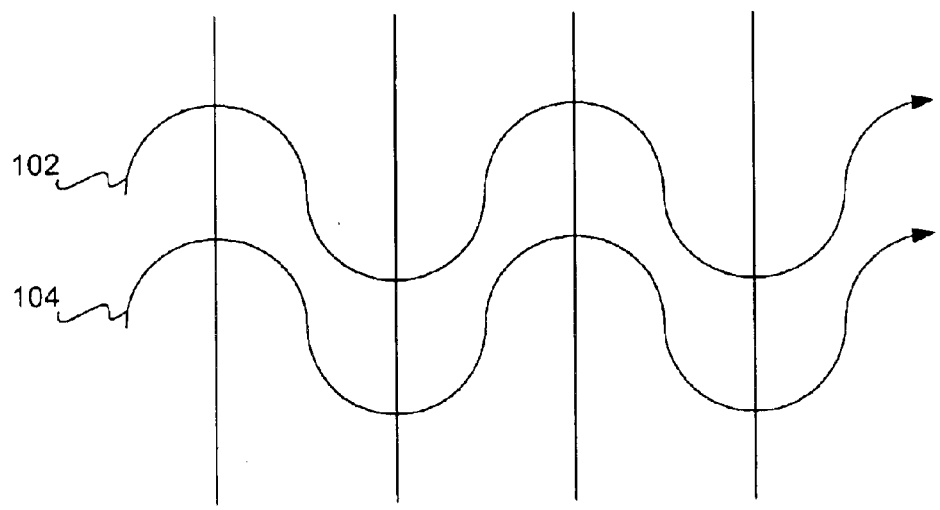
PRIOR ART FIG 1B
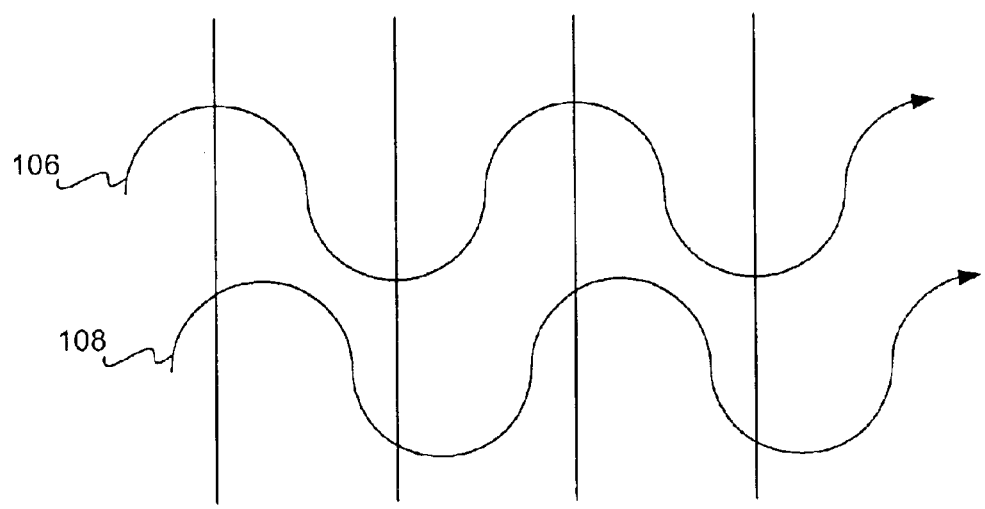

FIG 3
PRIOR ART
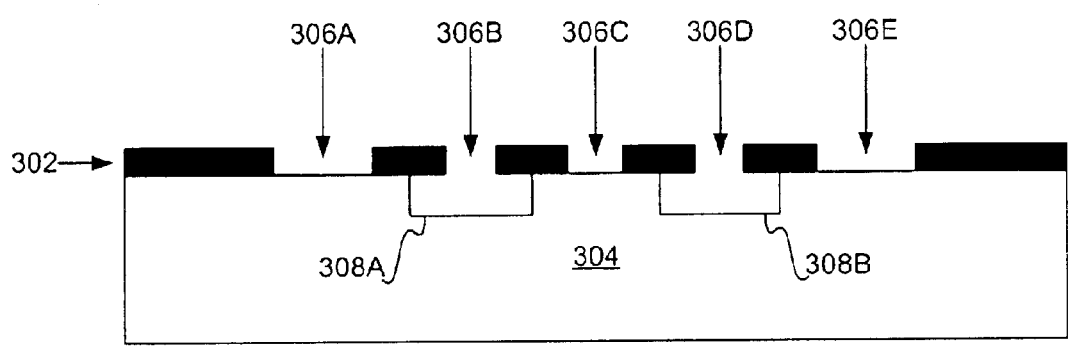
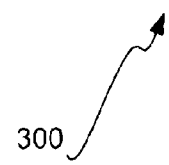

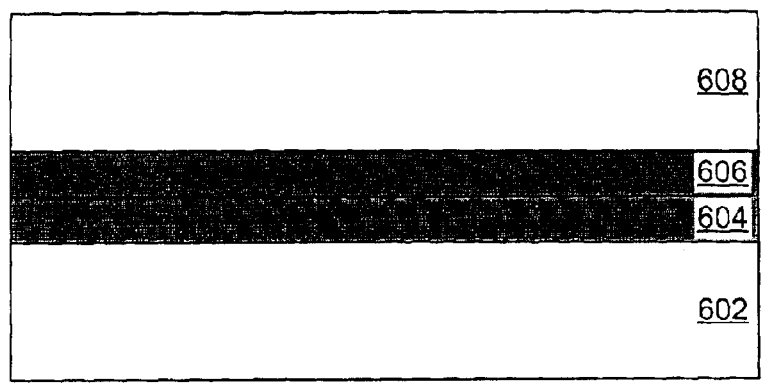
FIG 6A
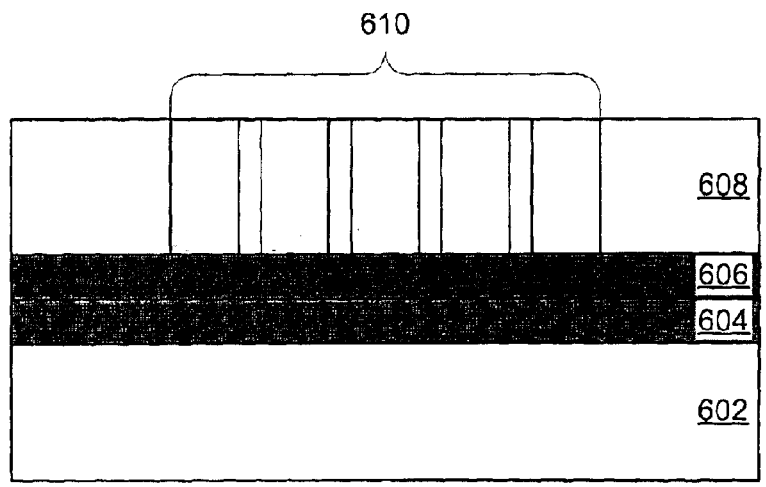
FIG 6B

FIG 6K
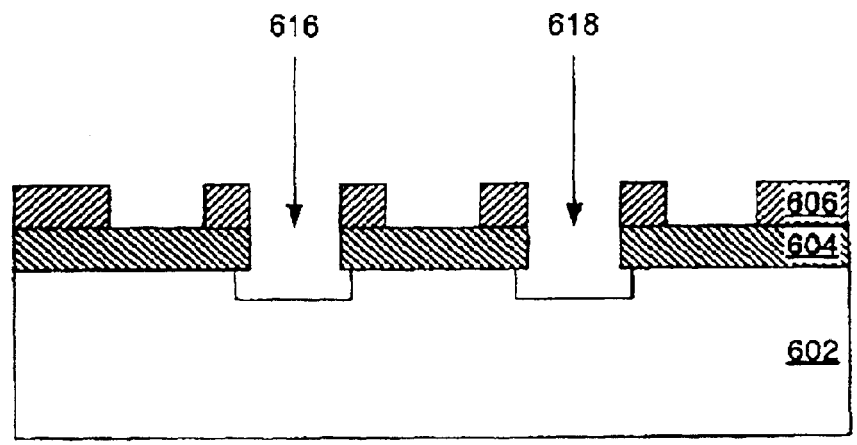
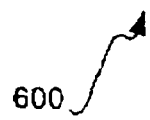
FIG 6L
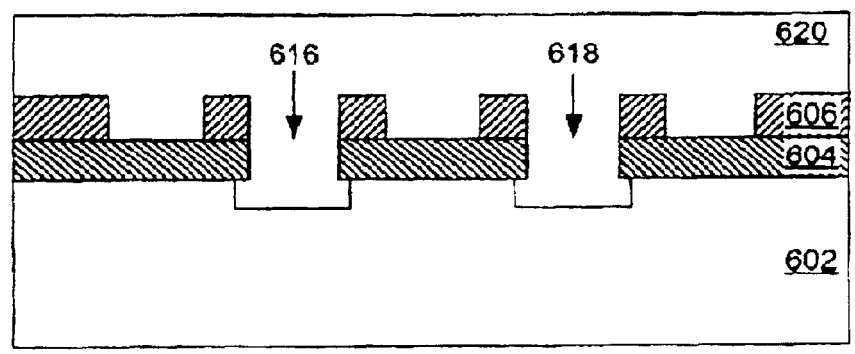
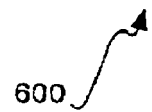

SINGLE TRENCH ALTERNATING PHASE SHIFT MASK FABRICATION

FIELD OF THE INVENTION

This invention relates generally to semiconductor device fabrication, and more particularly to the use of phase shift masks (PSM's) in conjunction with such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate in sub-wavelength lithography. The resulting features may deviate significantly in size and shape from the ideal pattern drawn by the circuit designer. For example, as two mask patterns get closer together, diffraction problems occur. At some point, the normal diffraction of the exposure rays start touching, leaving the patterns unresolved in the resist. The blending of the two diffraction patterns into one results from all the rays being in the same phase. Phase is a term that relates to the relative positions of a wave's peaks and valleys. In FIG. 1A, the waves 102 and 104 are in phase, whereas in FIG. 1B, the waves 106 and 108 are out of phase.

One way to prevent the diffraction patterns from affecting two adjacent mask patterns is to cover one of the openings with a transparent layer that shifts one of the sets of exposing rays out of phase, which in turn nulls the blending. This is shown in FIGS. 2A and 2B. In FIG. 2A, the mask 202 causes an undesirable light intensity as indicated by the line 204. In FIG. 2B, adding the phase shifter 206 to the mask 202 causes a desirable light intensity as indicated by the line 208. This mask 202 in FIG. 2B with the phase shifter 206 added is a phase shift mask (PSM), which is a special type of photomask.

A typical photomask affects only one of the properties of light, the intensity. Where there is chromium, which is an opaque region, an intensity of zero percent results, whereas where the chromium has been removed, such that there is a clear or transparent region, an intensity of substantially 100 percent results. By comparison, a PSM not only changes the intensity of the light passing through, but its phase as well. By changing the phase of the light by 180 degrees in some areas, the PSM takes advantage of how the original light wave adds to the 180-degree wave to produce zero intensity as a result of destructive interference.

PSM's have gained increased popularity among manufacturers as the feature sizes they are tasked with printing become smaller, and the topography over which these features must be printed becomes more varied. PSM's offer their customers the opportunity to greatly improve the resolution capability of their steppers. This allows them to print smaller feature sizes using the same equipment and processes.

One particular type of PSM is referred to as an alternating PSM. The PSM of FIG. 2B was one example of an alternating PSM. In an alternating PSM, closely spaced apertures are processed so that light passing through any particular aperture is 180 degrees out of phase from the light passing through adjacent apertures. Any light that spills over into the dark region from the two edges that are out of phase will destructively interfere. This reduces the unwanted exposure in the center dark region.

FIG. 3 shows another example of an alternating PSM, and more specifically, a single-trench alternating PSM 300. The PSM 300 includes two layers, a chromium layer 302, and a quartz layer 304. The chromium layer 302 is the same type of layer typically found in other, non-PSM photomasks, in which light is exposed therethrough to an underlying semiconductor wafer. Clear regions within the chromium layer 302 allow light to pass through, whereas opaque regions within the chromium layer 302 prevent light from passing through. The clear and opaque regions are arranged to correspond to a desired semiconductor design, or pattern. In the PSM 300, there are clear regions 306A, 306B, 306C, 306D, and 306E.

The quartz layer 304 is more generally a clear or transparent layer, in which single trenches are alternatively added beneath the clear regions of the chromium layer 302 to phase shift light passing through these clear regions. For instance, the alternating clear regions 306A, 306C, and 306E of the chromium layer 302 do not have single trenches beneath them in the quartz layer 304. Conversely, the alternating regions 306B and 306D of the chromium Elayer 302 have single trenches 308A and 308B beneath them in the quartz layer 304. The PSM 300 is an alternating PSM in that only every other clear region of the chromium layer 302 has a phase shifter beneath them in the quartz layer 304. The PSM 300 is a single-trench alternating PSM in that these phase shifters are the single trenches 308A and 308B, as compared to other types of phase shifters, such as double trenches, and so on.

The manner by which the PSM 300 of FIG. 3 can be fabricated according to the prior art is summarized with reference to FIGS. 4A and 4B. In FIG. 4A, the clear regions within the chromium layer 302 are already present, by a process of photoresist patterning, etching the chromium layer 302, and then stripping the remaining photoresist. A new layer of photoresist 402 has been added, such as by a coating process, and patterned to correspond to where the single trenches 308A and 308B of FIG. 3 will be made. In FIG. 4B, the quartz layer 304 is first dry etched, and then wet etched using sodium hydroxide (NaOH) to form the single trenches 308A and 308B. The photoresist layer 402 is then removed by a photoresist strip process to result in the PSM 300 of FIG. 3.

This conventional approach to manufacturing the alternating single-trench PSM 300 has several disadvantages, however. To not damage the quartz layer 304 and/or the chromium layer 302, as well as possibly for other reasons, the patterning of the photoresist resulting in the photoresist layer 402 of FIG. 4A must be accomplished by using laser-beam writing to properly expose the photoresist. This means that more conventional tools, such as e-beam writers, cannot be used to expose the photoresist to result in the photoresist layer 402 of FIG. 4A. Furthermore, phase defects in the PSM 300 are difficult to repair when using the process summarized with reference to FIGS. 4A and 4B.

The depth of the quartz layer 304 after dry etching, and before wet etching, also cannot be accurately measured with the photoresist layer 402 remaining on top of the chromium layer 302, which is problematic to ensure that the phase shift resulting from the PSM 300 is correct. Accurate measurement cannot be accomplished because the photoresist layer 402 is an inaccurate reference from which to measure the depth of the of the quartz layer 304 after dry etching. Furthermore, the wet etching of the quartz layer 304, because it uses NaOH, may cause the photoresist layer 402 to peel, decreasing the likelihood that the single trenches 308A and 308B will be properly fabricated. A different approach to single-trench alternating PSM manufacture, described in U.S. Pat. No. 5,958,630, also suffers from at least some of these problems.

Therefore, there is a need for a process for fabricating a single-trench alternating PSM that overcomes the problems associated with manufacturing such PSM's in the prior art. Such a process should be able to use equipment other than laser writers for use in photoresist patterning in preparation of etching the trenches in the quartz layer. The process should also enable more easily accomplished repairs of any defects in the PSM, and enable accurate measurement of the depth of the trenches without having to strip, reapply, and re-pattern photoresist. The process should finally avoid damaging photoresist, or otherwise increase the likelihood that the single trenches will be properly fabricated. For these and other reasons, there is a need for the present invention.

SUMMARY OF THE INVENTION

The invention relates to fabricating a single-trench alternating phase shift mask (PSM). An opaque layer over a mask layer, which is itself over a transparent layer, of the PSM is patterned according to a semiconductor design. The opaque layer may be a chromium layer, whereas the transparent layer may be a quartz layer. The mask layer and the transparent layer are dry etched through a photoresist layer that has been applied over the opaque layer and patterned according to an alternating PSM design.

The dry etching initially forms single trenches of the PSM. The transparent layer is next wet etched through the mask layer to completely form the single trenches of the PSM, where the photoresist layer has first been removed. The mask layer is dry etched again, where the single trenches of the PSM are initially filled with filler material to protect the single trenches from the dry etching. The filler material is finally removed. The filler material may be photoresist.

The invention provides for advantages not found within the prior art. The patterning of the photoresist layer prior to the dry etching of the mask layer and the transparent layer can be accomplished by e-beam writing, and not only laser beam writing as in the prior art. This is because the mask layer protects the transparent layer from damage that would otherwise result from e-beam writing. Either hydrogen fluoride (HF) or sodium hydroxide (NaOH) can be used to wet etch the transparent layer, as compared to the prior art, which only permits NaOH wet etching. The transparent layer can further be undercut by wet etching with megasonic cleaning. The depth of the single trenches after their initial formation by the first dry etching can be accurately measured, because the photoresist layer is removed prior to wet etching. That is, the opaque layer serves as a reference from which to measure the depth of the single trenches, allowing for accurate measurement.

Other advantages, embodiments, and aspects of the invention will become apparent by reading the detailed description that follows, and by referencing the attached drawings.

BRIEF DESCRIPTION OF THE DRAWINGS

FIGS. 1A and 1B are diagrams showing the difference between in-phase and out-of-phase waves.

FIG. 3 is a diagram showing an example of an alternating single-trench phase shift mask (PSM).

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 2A:
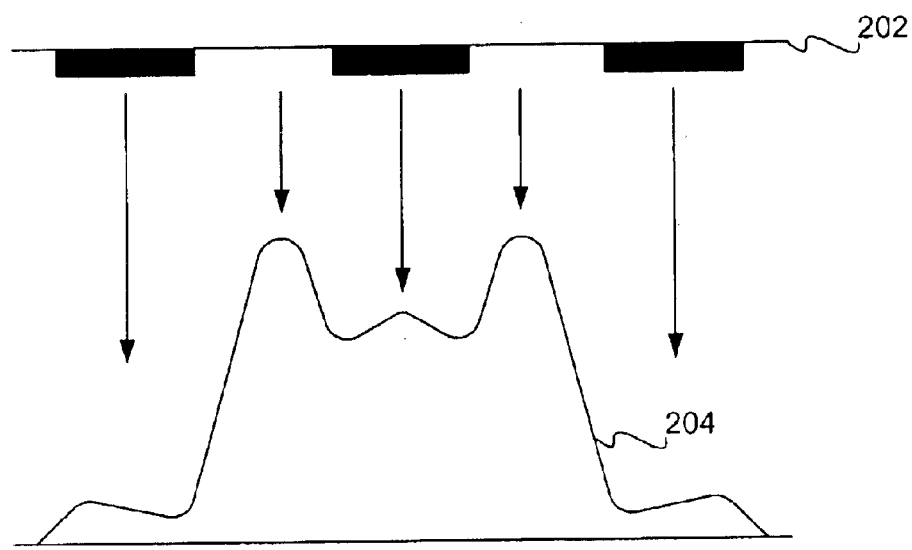
FIGS. 2A and 2B are diagrams showing the difference in the resulting light intensity between a photomask without phase shift and a photomask with phase shift.
Figure 2B:
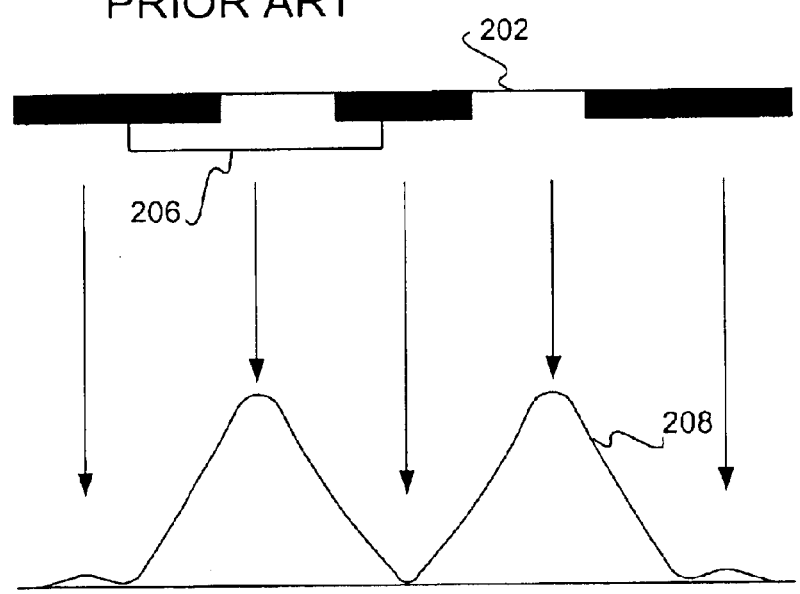
Figure 4A:
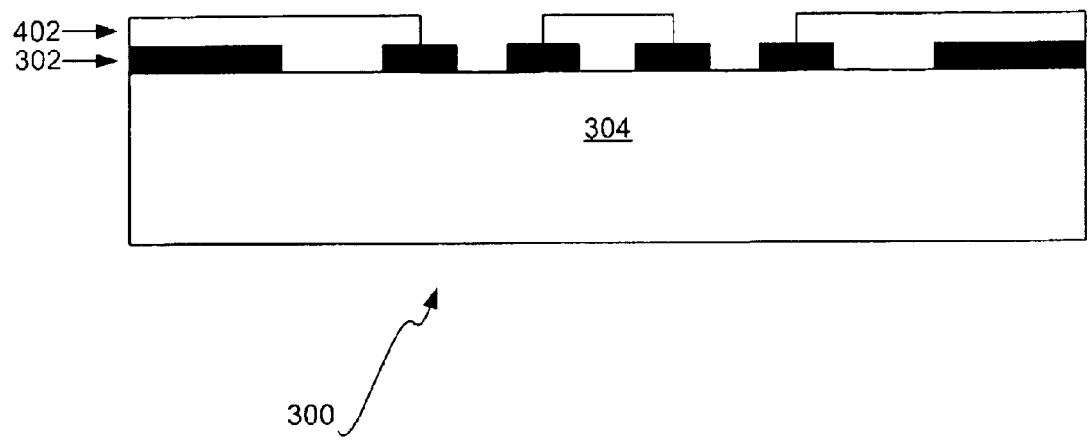
FIGS. 4A and 4B are diagrams showing how the PSM of FIG. 3 can be conventionally manufactured according to the prior art.
Figure 4B:
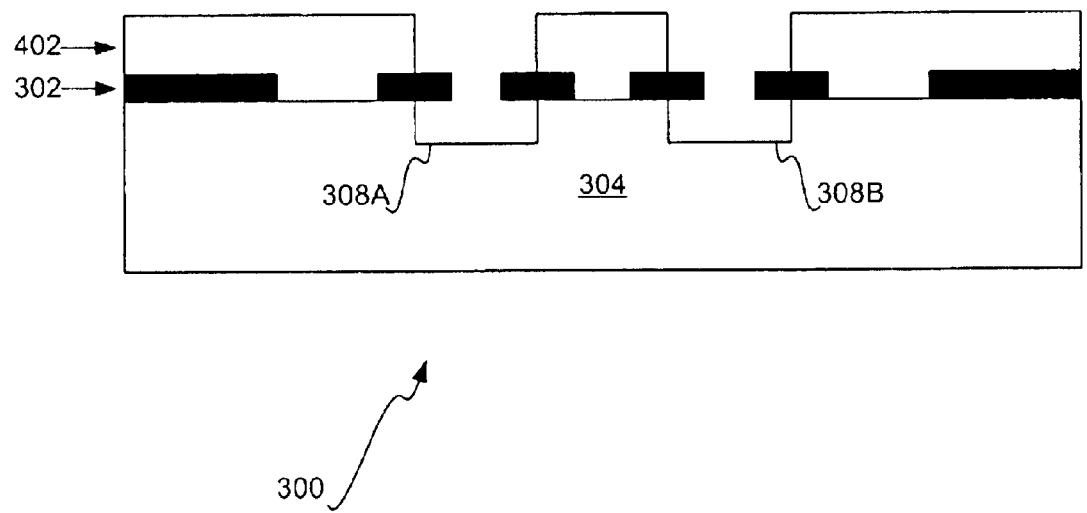
Figure 5:
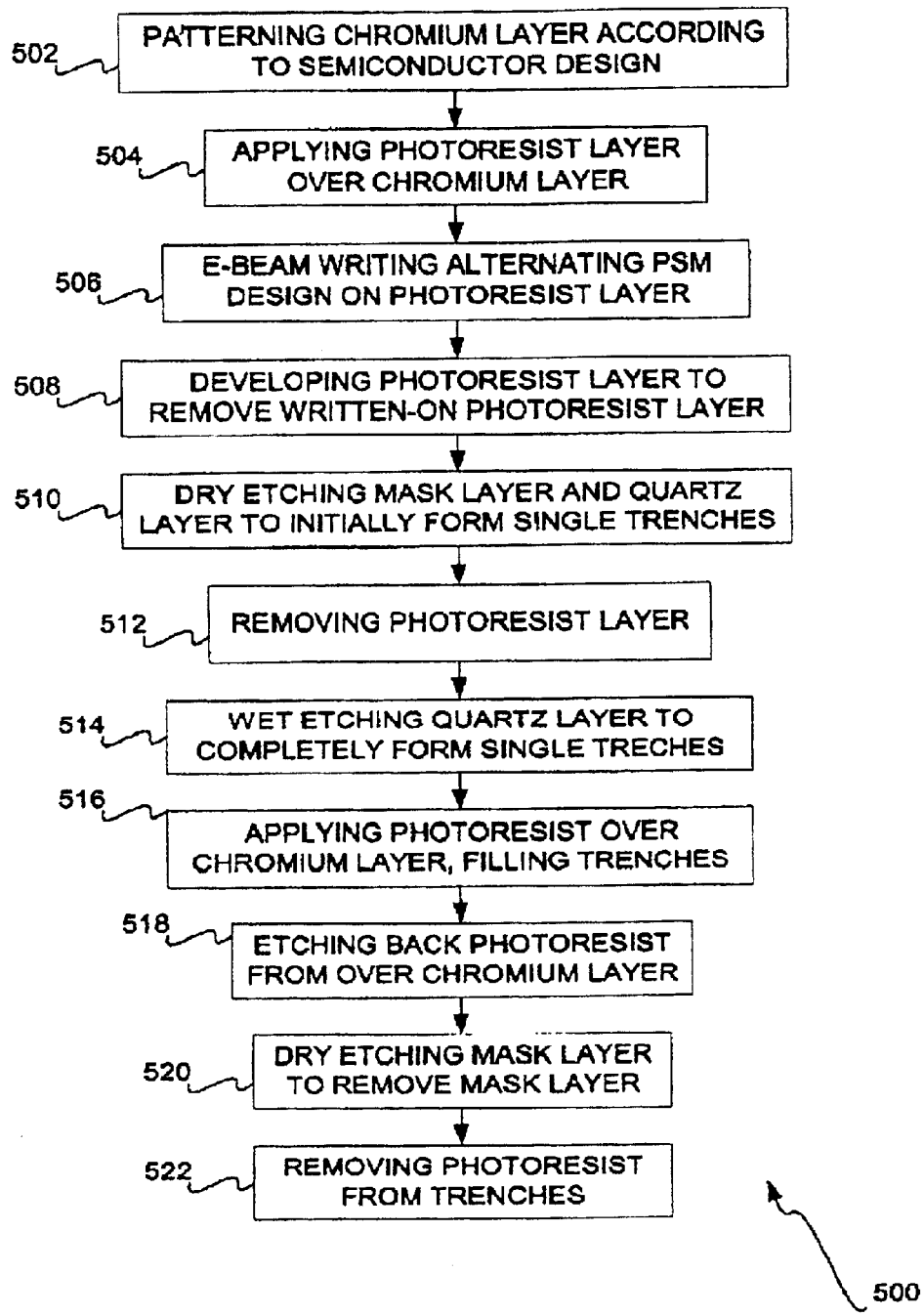
FIG. 5 is a flowchart of a method to fabricate an alternating single-trench PSM according to an embodiment of the invention.
Figure 6C:
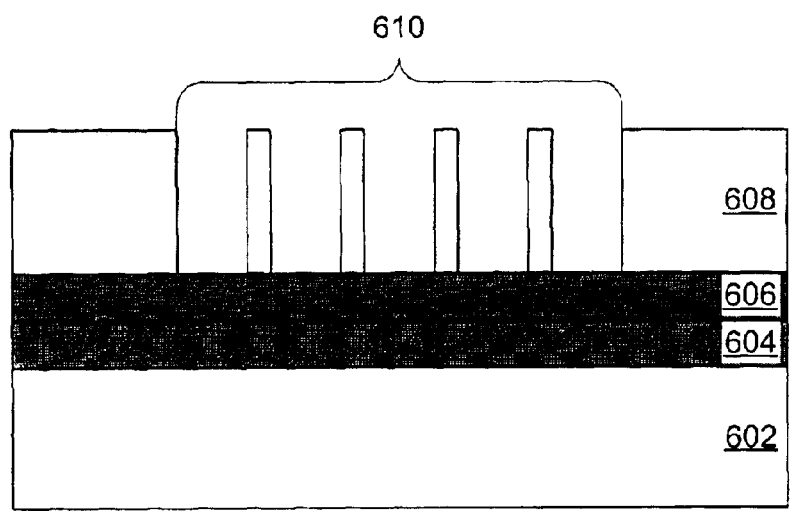
FIGS. 6A–6O are diagrams showing illustratively the method of FIG. 5.

FIG. 5 shows a method 500 to construct a single trench alternating phase shift mask (PSM) according to an embodiment of the invention. A chromium layer is first patterned according to a semiconductor design (502). The design is so that the PSM can ultimately be used to manufacture semiconductor devices of this design, by, for instance, photolithographic processes that use the PSM as the photomask. Performance of 502 is shown illustratively with reference to FIGS. 6A–6E. In FIG. 6A, the PSM 600 begins as a quartz layer 602, with a hard mask layer 604 over the quartz layer 602, a chromium layer 606 over the hard mask layer 604, and a photoresist layer 608 over the chromium layer 606. The quartz layer 602 is generally a type of transparent or clear layer. The hard mask layer 604 may be molybdenum silicon oxide (MoSiO), or alternatively a different conductive etching stop layer. The chromium layer 606 is generally a type of opaque layer.

Figure 6D:
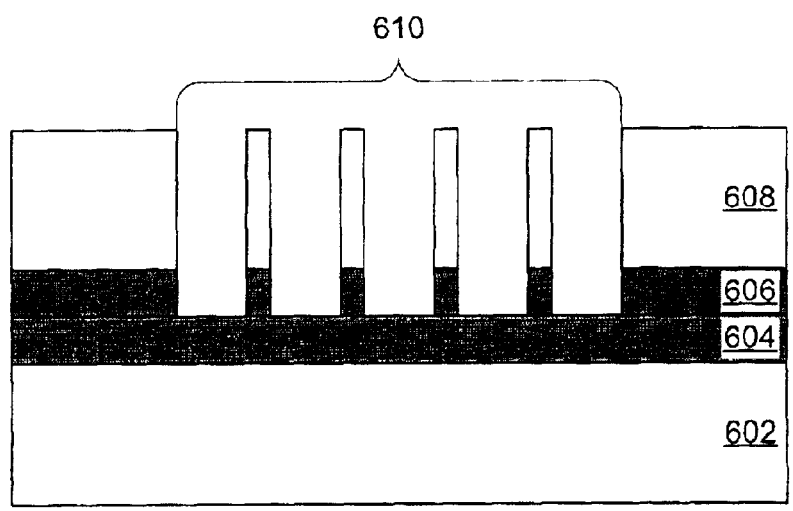
Figure 6E:
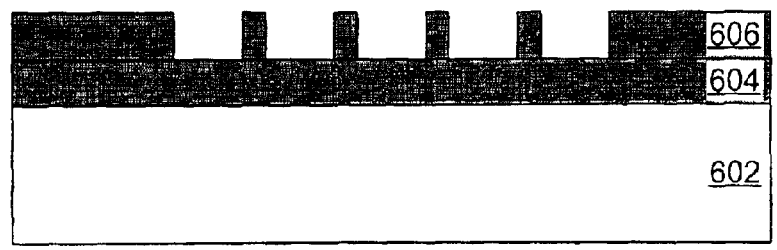

In FIG. 6B, the photoresist layer 608 is exposed according to the semiconductor design, as indicated by the regions 610. Exposure may be accomplished by e-beam or laser writing the semiconductor design in the photoresist layer 608, to result in the regions 610. In FIG. 6C, the photoresist is developed to remove those parts of the photoresist layer 608 that was exposed or written on, such that there is no longer photoresist within the regions 610. In FIG. 6D, the chromium layer 606 is etched down to the hard mask layer 604, to remove those parts of the chromium layer 606 that were exposed by exposure and development of the photoresist layer 608. Finally, the photoresist layer 608 is removed, such as by stripping, resulting in FIG. 6E, where the patterned chromium layer 606 remains over the layers 604 and 602.

Referring back to FIG. 5, a new photoresist layer is next applied over the chromium layer (504). This can be accomplished by photoresist coating the chromium layer. The new photoresist layer is exposed according to an alternating PSM design (506), and the photoresist layer is developed to remove the exposed parts of the layer (508). The alternating PSM design is so that a single-trench alternating PSM results for the semiconductor design when the quartz layer is etched. The mask layer and the quartz layer are next dry etched (510), which initially forms the single trenches of the PSM, and the new photoresist layer is removed (512). Performance of 504, 506, 508, 510, and 512 is shown illustratively with reference to FIGS. 6F–6J.

Figure 6F:
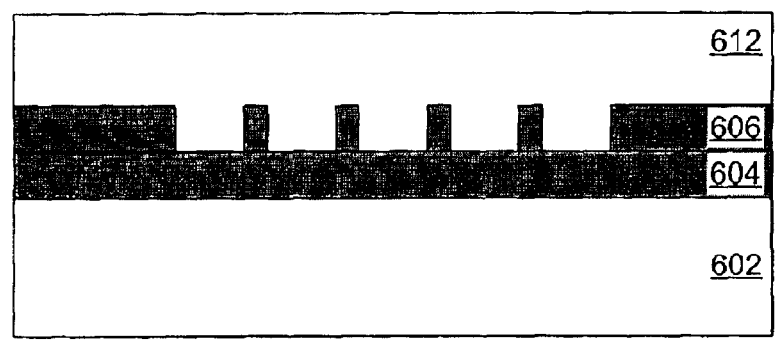
Figure 6G:
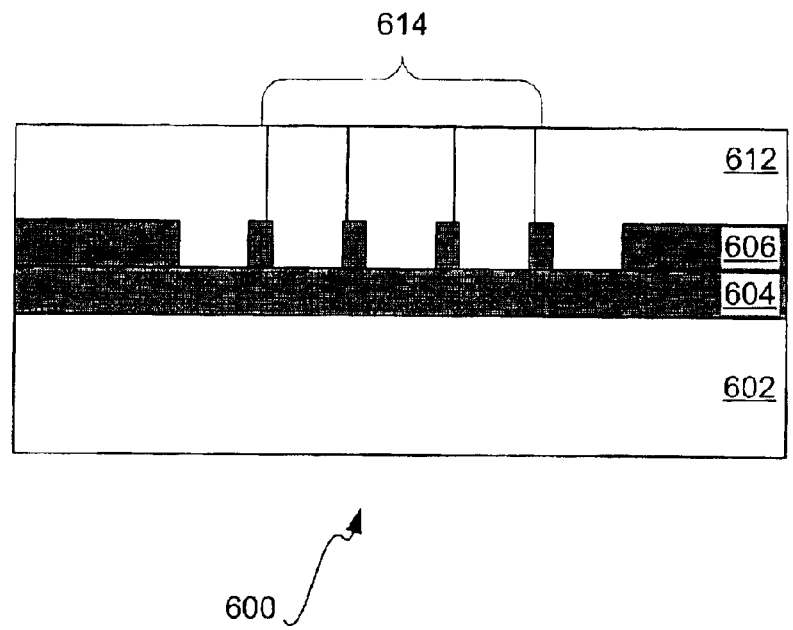
Figure 6H:
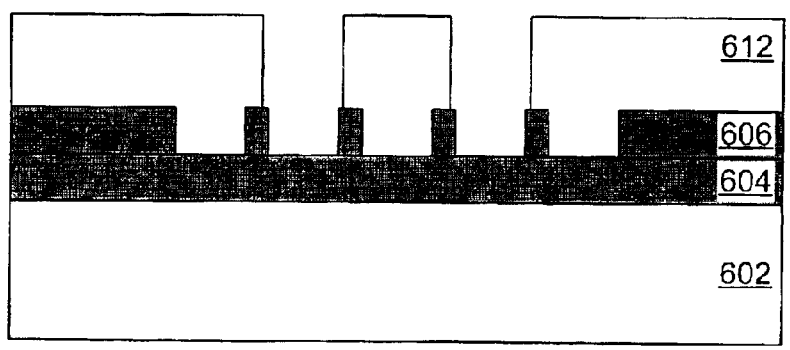
Figure 6I:
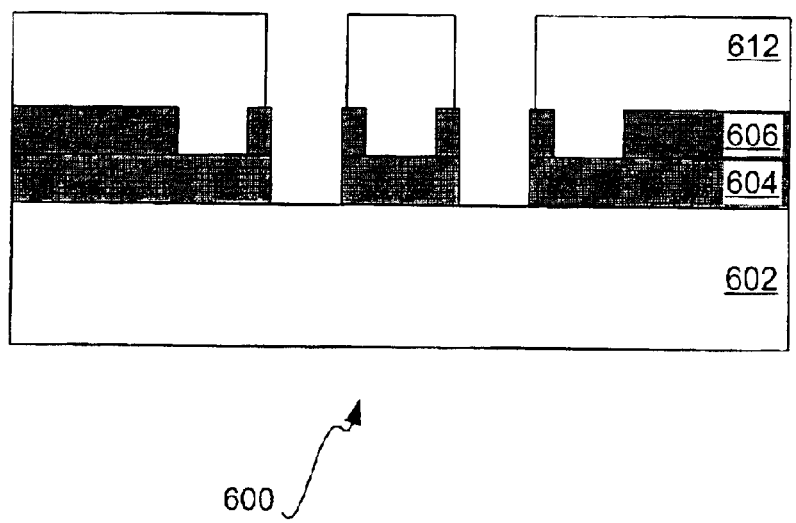
Figure 6J:
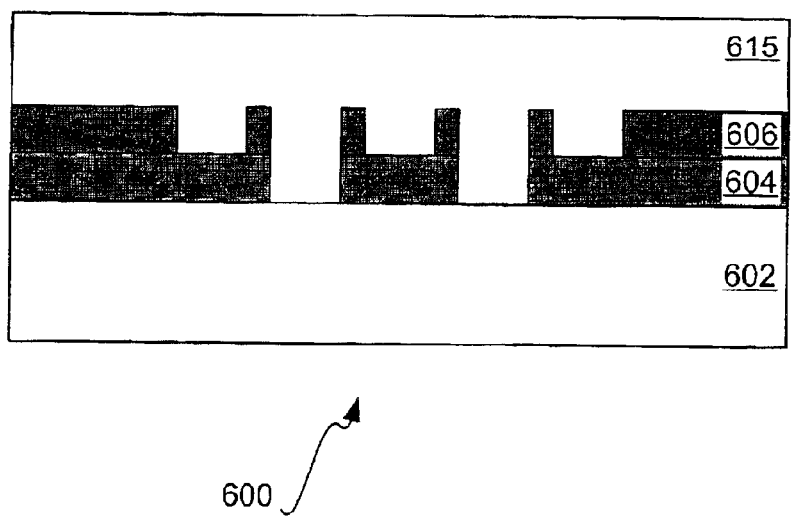

In FIG. 6F, the new photoresist layer 612 has been applied over the chromium layer 606. In FIG. 6G, the regions 614 result from exposure of the new photoresist layer 612, such as by e-beam or laser beam writing the alternating PSM design on the new photoresist layer 612. The underlying quartz layer 602 is not damaged by e-beam writing in particular, because of the presence of the mask layer 604. In FIG. 6H, the new photoresist layer 612 has been developed, such that the parts of the layer 612 that were written on or otherwise exposed are removed. The resulting photoresist layer 612 corresponds to the alternating PSM design. In FIG. 6I, dry etching has been performed through the chromium layer 606 and the hard mask layer 604, resulting in initial formation of the trenches 616 and 618. In FIG. 6J, the photoresist layer 612 of FIG. 6I has been removed. Once the layer 612 has been removed, the dry etching depth is easily measured, because the chromium layer 606 provides an accurate reference from which to measure the depth of the trenches 616 and 618 as have been initially formed.

Referring back to FIG. 5, the quartz layer is wet etched (514), which completely forms the single trenches that were initially formed in the dry etching of 510. This is shown illustratively with reference to FIG. 6K. In FIG. 6K, the quartz layer 602 is wet etched. Etching is isotropic, in that there is some undercutting of the quartz layer 602 directly underneath the chromium layer 606 and the hard mask layer 604. The wet etching can be accomplished using hydrogen fluoride (HF) or sodium hydroxide (NaOH). The presence of the hard mask layer 604 protects those parts of the quartz layer 602 that are not to be etched from being etched. That is, the wet etchant comes into contact with the quartz layer 602 only in the single trenches 616 and 618. Furthermore, the wet etching can include megasonic cleaning, which decreases the potential for the PSM 600 to have defects, as compared to the prior art, in which defects are more common, because cleaning cannot be accomplished as frequently.

Referring back to FIG. 5, photoresist is applied over the chromium layer, which fills the single trenches that have been formed (516). The photoresist is etched back, so the only photoresist that remains is that which fills the single trenches (518), and the mask layer where exposed is etched until it is removed (520). The photoresist in the trenches is removed (522), such as via stripping, resulting in a single-trench alternating PSM. Performance of 516, 518, 520, and 522 is shown illustratively with reference to FIGS. 6L–6O.

Figure 6M:
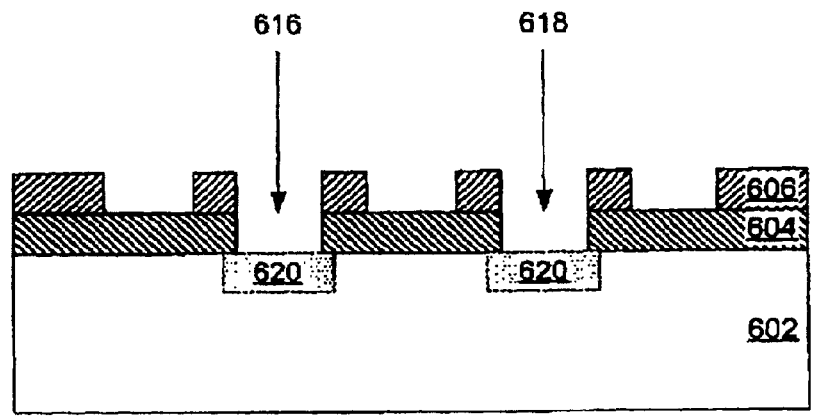
Figure 6N:
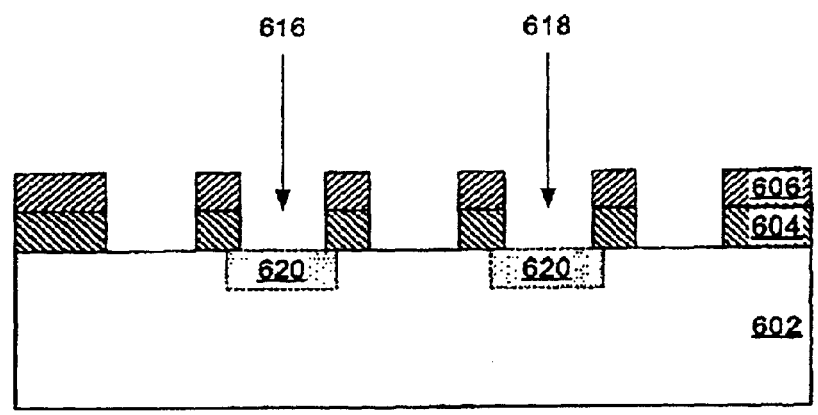
Figure 6O:
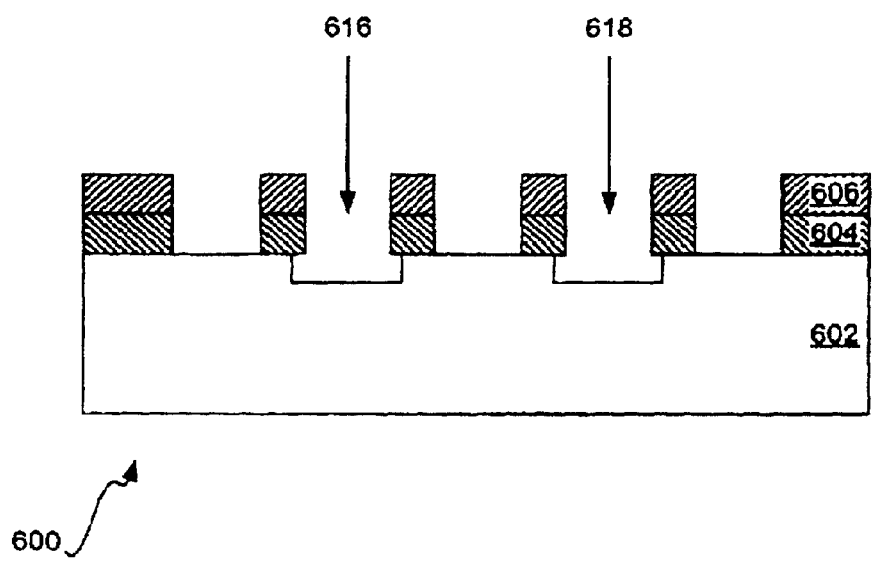

In FIG. 6L, photoresist 620 is coated over the chromium layer 606, which fills the trenches 616 and 618. In FIG. 6M, the photoresist 620 is etched back. The only parts of the photoresist 620 that remain are those in the trenches 616 and 618. In FIG. 6N, the exposed parts of the hard mask layer 604 are etched away. The presence of the photoresist 620 in the trenches 616 and 618 protects the quartz layer 602 from the etchant used to remove the exposed parts of the hard mask layer 604. Furthermore, the chromium layer 606 is at least substantially impervious to this etchant. Finally, in FIG. 6O, the remaining of the photoresist 620 in the trenches 616 and 618 is removed, such as via stripping, and the final single-trench alternating PSM 600 results.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for fabricating a single-trench alternating phase shift mask (PSM) comprising:

patterning an opaque layer over a mask layer over a transparent layer of the PSM according to a semiconductor design;

first dry etching the mask layer and the transparent layer through a photoresist layer applied over the opaque layer after the opaque layer has already been patterned according to the semiconductor design, the photoresist layer patterned according to an alternating PSM design, the first dry etching through the patterned photoresist layer initially forming single trenches of the PSM within the mask layer and the transparent layer according to the alternating PSM design;

wet etching the transparent layer through the mask layer as has been dry etched to completely form the single trenches of the PSM, the photoresist layer having first been removed; and, second dry etching die mask layer, the single trenches of the PSM initially filled with filler material to protect the single trenches from the second dry etching, the filler material subsequently removed.

2. The method of claim 1, wherein patterning the opaque layer comprises:

applying a photoresist layer over the opaque layer;

exposing the photoresist layer according to the semiconductor design;

developing the photoresist layer to remove exposed parts of the photoresist layer;

etching the opaque layer through the exposed parts of the photoresist layer; and, removing the remaining photoresist layer.

3. The method of claim 2, wherein exposing the photoresist layer according to the semiconductor design comprises e-beam writing semiconductor design on the photoresist layer.

4. The method of claim 1, wherein first dry etching the mask layer and the transparent layer comprises:

applying the photoresist layer over the opaque layer;

exposing the photoresist layer according to the alternating PSM design;

developing the photoresist layer to remove exposed parts of the photoresist layer dry etching the mask layer and the transparent layer through the exposed parts of the photoresist layer; and, removing the remaining photoresist layer.

5. The method of claim 4, wherein exposing the photoresist layer according to the alternating PSM design comprises e-beam writing the alternating PSM design on the photoresist layer.

6. The method of claim 1, wherein wet etching the transparent layer comprises using one of hydrogen fluoride (HF) and sodium hydroxide (NaOII).

7. The method of claim 1, wherein wet etching the transparent layer comprises initially removing the photoresist layer.

8. The method of claim 1, wherein second dry etching the mask layer comprises:
- applying the filler material over the opaque layer, such that the single trenches of the PSM are filled with the filler material;
- etching bhack the tiller material so that only the filler material that has filled the single trenches of the PSM remains;
- dry etching the mask layer to remove exposed parts of the mask layer through the opaque layer;
- removing the filler material.

9. The method of claim 1, further comprising measuring a depth of the transparent layer after first dry etching the mask layer and the transparent layer and before wet etching of the transparent layer.

10. The method of claim 1, wherein the mask layer exposed after removal of the photoresist layer protects otherwise exposed parts of the transparent layer during wet etching.

11. The method of claim 1, wherein the opaque layer comprises a chromium layer.

12. The method of claim 1, wherein the transparent layer comprises a quartz layer.

13. The method of claim 1, wherein the mask layer comprises a molybdenum silicon oxide (MoSiO) layer.

14. The method of claim 1, wherein the filler material comprises resist.

* * * * *